United States Patent
Sadana et al.

(10) Patent No.: US 12,136,682 B2
(45) Date of Patent: Nov. 5, 2024

(54) DEVICE INTEGRATION USING CARRIER WAFER

(71) Applicant: International Business Machines Corporation, Armonk, NY (US)

(72) Inventors: Devendra K. Sadana, Pleasantville, NY (US); Ning Li, White Plains, NY (US); Ghavam G. Shahidi, Pound Ridge, NY (US); Frank Robert Libsch, White Plains, NY (US); Stephen W. Bedell, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 17/489,706

(22) Filed: Sep. 29, 2021

(65) Prior Publication Data
US 2023/0116053 A1    Apr. 13, 2023

(51) Int. Cl.
| | | |
|---|---|---|
| *H01L 31/12* | (2006.01) | |
| *H01L 31/18* | (2006.01) | |
| *H01L 33/00* | (2010.01) | |

(52) U.S. Cl.
CPC .......... *H01L 31/125* (2013.01); *H01L 31/184* (2013.01); *H01L 33/0062* (2013.01)

(58) Field of Classification Search
CPC ... H01L 25/167; H01L 27/15; H01L 29/6603; H01L 29/6606; H01L 29/6608; H01L 29/66113; H01L 29/66159; H01L 29/66204; H01L 29/864; H01L 29/868; H01L 31/035236; H01L 31/035245; H01L 31/035254; H01L 31/035263; H01L 31/107; H01L 31/125; H01L 31/145; H01L 31/147; H01L 31/153; H01L 31/165; H01L 31/167; H01L 31/173; H01L 31/184; H01L 31/1852; H01L 31/1896; H01L 33/0012; H01L 33/0062; H01L 33/0093;
(Continued)

(56) References Cited

U.S. PATENT DOCUMENTS

| | | |
|---|---|---|
| 6,039,803 A | 3/2000 | Fitzgerald |
| 6,455,398 B1 | 9/2002 | Fonstad, Jr. |
| 7,812,249 B2 | 10/2010 | King |

(Continued)

OTHER PUBLICATIONS

M. Seal et al., "Electrical conductivity across InP and GaAs wafer-bonded structures with miscut substrates," 42nd Photovoltaic Specialist Conference (PVSC), 2015, 6 pp.

*Primary Examiner* — Calvin Y Choi
(74) *Attorney, Agent, or Firm* — L. Jeffrey Kelly; Otterstedt & Kammer PLLC

(57) ABSTRACT

Compound semiconductor and silicon-based structures are epitaxially formed on semiconductor substrates and transferred to a carrier substrate. The transferred structures can be used to form discrete photovoltaic and light-emitting devices on the carrier substrate. Silicon-containing layers grown on doped donor semiconductor substrates and compound semiconductor layers grown on off-cut semiconductor substrates form elements of the devices. The carrier substrates may be electrically insulating substrates or include electrically insulating layers to which photovoltaic and/or light-emitting structures are bonded.

2 Claims, 3 Drawing Sheets

(58) Field of Classification Search
CPC ......... H01L 33/04; H01L 33/06; H10K 30/87; H10K 50/115
See application file for complete search history.

(56) References Cited

U.S. PATENT DOCUMENTS

| | | |
|---|---|---|
| 7,863,650 B2 | 1/2011 | Letertre |
| 8,882,909 B2 | 11/2014 | Von Kaenel |
| 10,374,120 B2 | 8/2019 | Atwater, Jr. |
| 2010/0116329 A1 | 5/2010 | Fitzgerald |
| 2011/0079796 A1* | 4/2011 | Wober ................... H01L 27/15 257/89 |
| 2017/0033270 A1* | 2/2017 | Lu ........................... H01L 33/60 |
| 2018/0287002 A1* | 10/2018 | Bedell ................. H01L 31/0687 |
| 2019/0006548 A1* | 1/2019 | Wei ..................... H01L 31/1804 |
| 2020/0365785 A1* | 11/2020 | Schubert ........... H01L 31/03048 |

* cited by examiner

DEVICE INTEGRATION USING CARRIER WAFER

BACKGROUND

The present invention relates generally to the electrical, electronic and computer arts and, more particularly, to the formation of optoelectronic structures and/or other electronic devices on electrically insulating structures.

2.5D and 3D bonding/packaging are employed to integrate multiple devices on a common carrier. The number of processing steps may add to the cost of structures including multiple devices, such as structures used within IoT (internet of things) technology. Many applications benefit from the use of semiconductor materials other than silicon. Device layers comprising III-V semiconductor materials may, for example, be grown on germanium substrates.

BRIEF SUMMARY

In one aspect, an exemplary method of fabricating a compound semiconductor device includes epitaxially growing a germanium layer on an off-cut semiconductor substrate, epitaxially growing a first compound semiconductor layer on the germanium layer, the first compound semiconductor layer having a first conductivity type, epitaxially growing an intrinsic compound semiconductor layer on the first compound semiconductor layer, and epitaxially growing a second compound semiconductor layer on the intrinsic compound semiconductor layer. The second compound semiconductor layer has a second conductivity type opposite from the first conductivity type. A monolithic structure comprising the first compound semiconductor layer, the intrinsic compound semiconductor layer and the second compound semiconductor layer is released from the off-cut semiconductor substrate and bonded to an electrically insulating surface of a carrier substrate.

In a further aspect, a method of fabricating a structure including a solar cell includes epitaxially growing an undoped semiconductor layer on a doped semiconductor substrate having a first conductivity type and epitaxially growing a doped semiconductor layer on the undoped semiconductor layer, the doped semiconductor layer having a second conductivity type opposite from the first conductivity type. A solar cell comprising the undoped semiconductor layer, the doped semiconductor layer and a surface layer of the doped semiconductor substrate is released from the substrate and bonded to an electrically insulating surface of a carrier substrate.

An optoelectronic assembly includes a carrier substrate including an electrically insulating surface and an optoelectronic structure bonded to the electrically insulating surface of the carrier substrate. The optoelectronic structure includes a first semiconductor layer having a first conductivity type, an intrinsic semiconductor layer on the first semiconductor layer, and a second semiconductor layer on the intrinsic semiconductor layer and having a second conductivity type, the second conductivity type being opposite from the first conductivity type. The intrinsic semiconductor layer is between the first semiconductor layer and the second semiconductor layer. One of the first semiconductor layer and the second semiconductor layer is bonded to the electrically insulating surface of the carrier substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Integration of III-V light source or III-V photovoltaic device on a carrier substrate;
Simplifying 2.5D and 3D integration;
Lowering packaging costs;
Enabling IoT structures including silicon and III-V devices.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
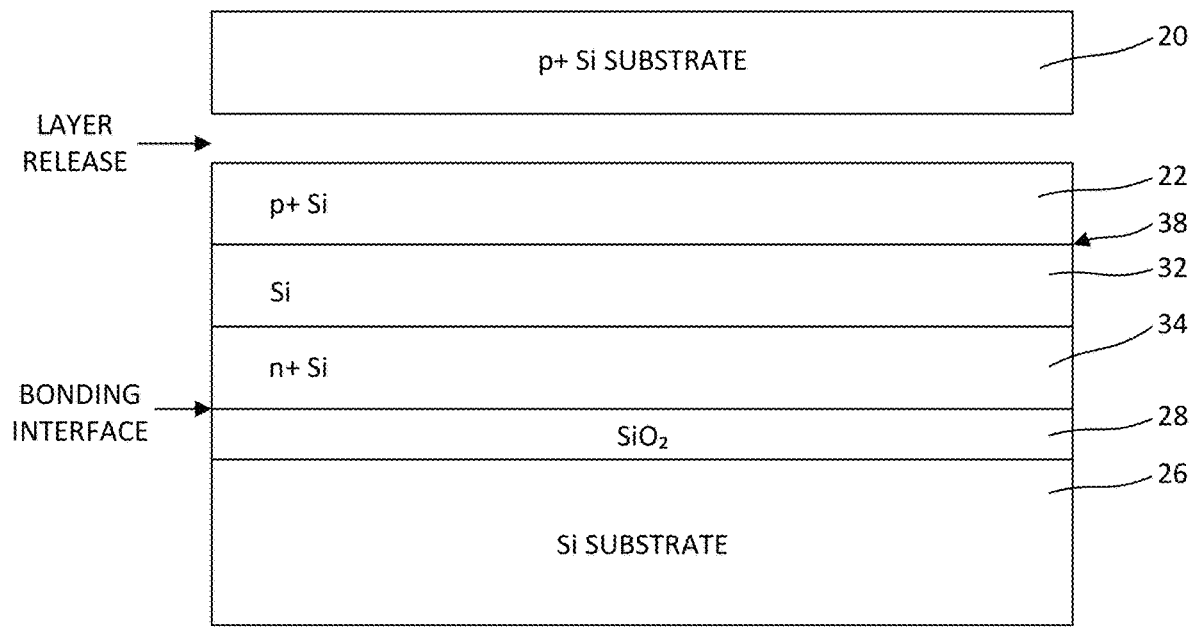
FIG. 1 is a schematic, cross-sectional illustration of a solar cell comprising an off-cut semiconductor layer released from a donor substrate and bonded to a carrier substrate.

A donor semiconductor substrate 20 and a solar cell fabricated using the donor semiconductor substrate are schematically illustrated in FIG. 1. In some embodiments, the semiconductor substrate 20 is a heavily doped silicon substrate. In an exemplary embodiment, the silicon donor substrate 20 has either n-type or p-type conductivity. As used herein, the term "conductivity type" denotes a dopant region being p-type or n-type. The designation "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous. The dopants incorporated in the donor substrate 20 may, for example, be phosphorus in a concentration in the range of $1-5 \times 10^{18}$ $cm^{-3}$ in Si in embodiments wherein an n+ donor substrate is employed. Various techniques can be employed to incorporate dopants in semiconductors, including implantation and diffusion.

The carrier substrate 24 in the exemplary embodiment includes a silicon substrate layer 26 and an oxide layer 28. The oxide layer comprises silicon dioxide in some exemplary embodiments. As described below, multiple devices can be integrated on a common carrier substrate.

An exemplary process allows the transfer of a solar cell structure fabricated on the donor substrate 20 to a carrier substrate 24. Referring to FIG. 1, a substantially undoped silicon layer 32 and a heavily doped silicon layer 34 are epitaxially grown, respectively, on a heavily doped donor substrate 20. It will be appreciated that the undoped silicon layer 32 may or may not contain some impurities, but is not intentionally doped. The conductivity of the donor substrate 20 is opposite to that of the heavily doped silicon layer 34. In other words, if the donor substrate is a p+ Si substrate, the heavily doped silicon layer 34 is an n+ layer.

The epitaxial deposition process may employ the deposition chamber of a chemical vapor deposition type apparatus, such as a low pressure chemical vapor deposition (LPCVD) apparatus. A number of different precursors may be used for the epitaxial deposition of the undoped, intrinsic Si layer 32 and the in situ doped silicon material forming the heavily doped layer 34. In some embodiments, the gas source for the deposition of an epitaxially formed semiconductor layers may include silicon (Si) deposited from silane, disilane, trisilane, tetrasilane, hexachlorodisilane, tetrachlorosilane, dichlorosilane, trichlorosilane, disilane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. In-situ doping of the heavily doped layer 34 can be conducted using conventional precursor materials and techniques, for example silane with diborane or phosphane depending on the conductivity type required.

A solar cell structure 38 comprising silicon layers 22, 34 having opposite conductivity and an intrinsic layer 32 therebetween is released from the donor substrate and bonded to the carrier substrate 24. The solar cell structure interfaces with an oxide layer 28 to which it is bonded. In one embodiment, the solar cell structure is a p+–i–n+ structure. Alternatively, the solar cell structure may be an n+–i–p+ structure. As discussed further below, multiple devices may be integrated on a common carrier substrate, including both solar cells and other types of electronic devices.

One layer transfer wafer bonding process that has been employed for some applications is commonly known as the SmartCut process. The process involves the implantation of ions within a monocrystalline silicon wafer. The ions, typically hydrogen ions (H+), form a layer of microbubbles parallel to the wafer surface that later functions as a cleavage plane. The implanted wafer is fractured along the hydride-rich plane. In the exemplary embodiment, a microbubble layer (not shown) is formed within the donor substrate 20 at a depth corresponding to the desired thickness of a layer that forms part of the solar cell 38. The layer 22 to be cleaved from the donor substrate 20 using the SmartCut process or other suitable process has a uniform thickness. The thickness of an exemplary layer 22 may be between one and ten microns (1-10μ). The other layers comprising the solar cell structure 38 may also have thicknesses in the same range as the cleaved layer.

The doped layer 34 of the solar cell 38 and the oxide layer 28 are brought into contact and bonded. In some embodiments, the doped silicon layer 34 may itself include a surface oxide layer formed thereon (not shown), in which case the silicon oxide layer 28 would bond to the silicon oxide surface layer on the doped silicon layer 34. Techniques for wafer bonding of silicon oxide to silicon are well known to those of skill in the art and continue to be developed. The use of a silicon oxide layer on the doped silicon layer 34 may facilitate the use of some conventional wafer bonding techniques. Pressure and heat may be employed to facilitate bonding in some embodiments. The resulting structure includes a carrier substrate 24 and a solar cell structure 38 bonded thereto.

Figure 2:
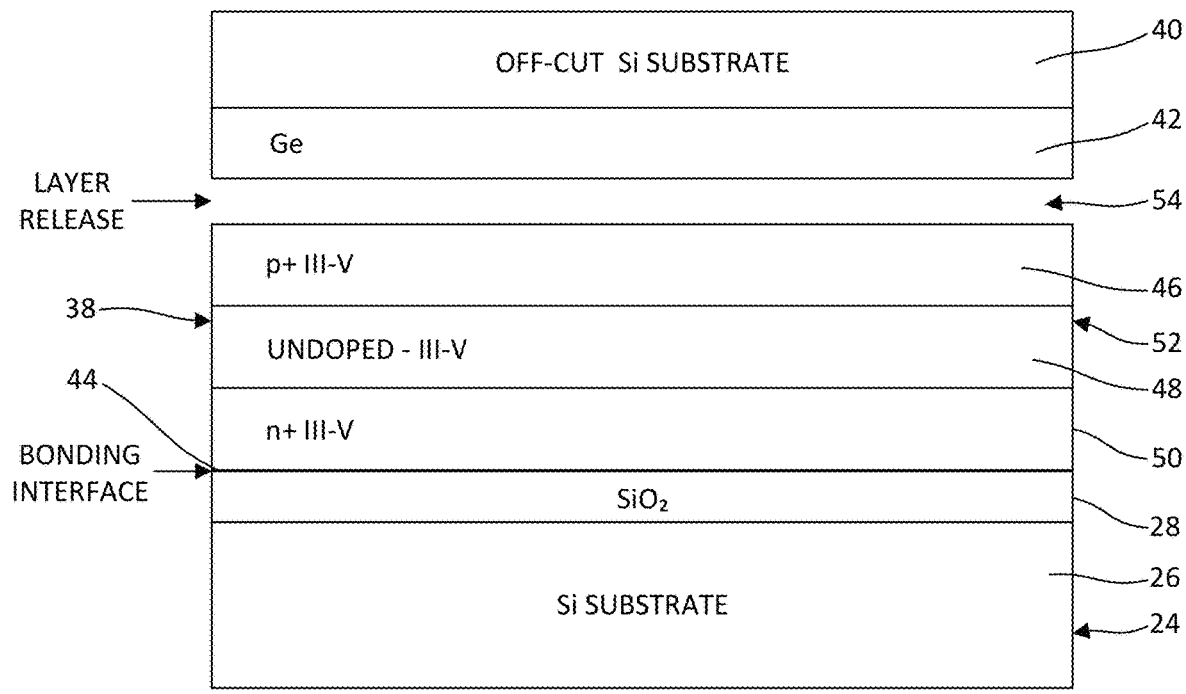
FIG. 2 is a schematic, cross-sectional illustration of a III-V photovoltaic device released from an off-cut donor substrate and bonded to a carrier substrate.

In a second exemplary embodiment, a compound semiconductor-on-insulator structure is bonded to silicon handle (carrier) substrate. In one exemplary embodiment, a III-V photovoltaic structure is fabricated on an off-cut silicon substrate 40 and then bonded to a carrier substrate that includes an electrically insulating layer. Referring to FIG. 2, a semiconductor substrate 40 having a desired lattice orientation is obtained, preferably miscut to a desired off-axis angle. In one exemplary embodiment, a silicon substrate 42 with a miscut (off-cut) of about six (6) degrees is employed to avoid anti-phase domains (APD). A germanium buffer layer 42 is epitaxially grown on the silicon substrate 40. The silicon substrate 40 can be obtained by cutting an on-axis silicon wafer at an angle to a primary surface such as the (100) surface of the wafer. In one exemplary embodiment, a<100> silicon substrate with miscut of about six (6) degrees is employed.

The germanium buffer layer 42 may be epitaxially grown on off-cut silicon with a silicon germanium (SiGe) gradient buffer layer (not shown) having sufficiently high quality to enable forming photovoltaic or other optoelectronic light emission devices thereon. An advantage of the disclosed process is to use a high mechanical strength, large size silicon or other suitable substrate having, for example, a diameter of twelve inches or even larger. Single crystal Ge substrates may not be available for this large size. The germanium deposition process may employ the deposition chamber of a chemical vapor deposition type apparatus, such as a low pressure chemical vapor deposition (LPCVD) or a metalorganic chemical vapor deposition (MOCVD) apparatus. A germanium gas source may, for example, be selected from the group consisting of germane, digermane, halogermane, dichlorogermane, trichlorogermane, tetrachlorogermane and combinations thereof. The temperature for epitaxial germanium deposition typically ranges from 450° C. to 900° C.

The germanium layer 42 is crystalline and preferably mostly or entirely mono-crystalline. The germanium layer may have a thickness between about five hundred to one thousand nanometers (500-1,000 nm). A lattice engineered semiconductor stack is epitaxially grown on the germanium layer 42.

III-V compound semiconductors are obtained by combining group III elements (for example, Al, Ga, In) with group V elements (for example, N, P, As, Sb). GaAs, InGaAs, InP, GaP, and GaN are examples of III-V compound semiconductors. In one exemplary embodiment, GaAs is epitaxially grown on the essentially defect-free surface of the germanium (Ge) layer 42. As GaAs and Ge have essentially the same lattice constant, strain-induced defects are avoided in such an embodiment and a buffer layer is not required. Various processes are familiar to those of skill in the art for epitaxially growing III-V semiconductor materials on semiconductor substrates such as germanium substrates. In the case of group III-V semiconductor materials, such processes include metalorganic chemical vapor deposition (MOCVD) and molecular beam epitaxy (MBE). Many different III-V compounds could be grown on the germanium layer 42 (or buffer layer thereon) depending upon the lattice constants of the III-V material and the goal of avoiding strain-induced epitaxial defects. Accordingly multiple precursors could be used. Depending on which III-V materials are to be grown and which precursors are used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on germanium and on other semiconductor materials are well known in the art and new methods continue to be developed.

In embodiments wherein a photovoltaic structure is to be formed, a first heavily doped III-V layer 46, an undoped III-V layer 48, and a second heavily doped III-V layer 50 are epitaxially grown, respectively, on the germanium layer 42. The first and third III-V layers have opposite conductivity types. For example, the first doped III-V semiconductor layer 46 may have p-type conductivity while the second doped III-V semiconductor layer 50 has n-type conductivity. In other embodiments, the first III-V semiconductor material layer 46 may have n-type conductivity. The dopant may be introduced via ion implantation or in situ. The effect of the dopant atom, i.e., whether it is a p-type or n-type dopant, depends occupied by the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donors depending on whether they occupy the site of group III or group V atoms, respectively. Such impurities are known as amphoteric impurities.

The dopants that provide the conductivity types of the first and second heavily doped III-V semiconductor layers 46, 50 of the resulting photovoltaic device may be present in a concentration ranging from $10^{18}$ atoms/cm$^3$ to $10^{19}$ atoms/cm$^3$. In some examples, the first and second heavily doped III-V semiconductor layers 46, 50 may have a thickness ranging from 100 nm to 2,000 nm. It is noted that the above thicknesses are provided for illustrative purposes only, and are not intended to limit the present disclosure. The intrinsic III-V layer 48 of the III-V photovoltaic device is not doped with an extrinsic dopant, e.g., n-type or p-type dopant, such as the dopants within the first and second heavily III-V semiconductor material layers of the III-V stack. The "intrinsic" III-V layers may include some unintentional doping resulting from diffusion of dopant ions from the doped III-V layers 46, 50 adjoining the surfaces thereof.

The III-V p+–i–n+ or n+–i–p+ photovoltaic structure 52 is released from the germanium buffer layer 42 and bonded to a carrier substrate 24 that includes a silicon substrate layer 26 and an oxide layer 28. A bonding interface 44 is formed between one of the heavily doped III-V layers 46, 50 of the photovoltaic structure and the oxide layer 28.

A process similar to the SmartCut process discussed above using hydrogen implantation is conducted to release the III-V photovoltaic structure 52, though within a germanium layer rather than silicon. A hydrogen layer (not shown) may be formed in the germanium layer 42 or between the germanium and first-grown III-V layer 46 via ion implantation. The hydrogen layer is generally parallel to the top surface of the germanium layer 42. In one or more alternative embodiments, inert gas ions are implanted within the germanium layer (or between the germanium and first-grown III-V layer) rather than hydrogen.

The SmartCut process does not work as well on all types of semiconductor materials as it does with respect to <100> silicon. With respect to III-V materials formed on miscut substrates, the cutting of the III-V material will not be along an ideal path. Moreover, the electrical properties of III-V materials can be effectively destroyed by hydrogen implantation by forming electrically active states. Ion implantation for facilitating wafer release is accordingly preferred within the germanium layer 42 or near the surface of the germanium layer rather than within the III-V layer 46 of the III-V p+−i−n+ or n+−i−p+ photovoltaic device 52 adjoining the germanium layer. Defective residual semiconductor material on the photovoltaic device, if any, is removed by, for example, selective etching, RIE (reactive ion etching) or CMP (chemical mechanical polishing).

Referring again to FIG. 2, the structure is fractured as discussed above along a cleavage plane 54 defined by the hydrogen layer or any alternative implanted ion layer that may be provided using techniques familiar to those of skill in the art. As discussed for example in U.S. Pat. No. 7,560,361, fracturing along an implant region in a semiconductor layer can be accomplished by annealing the structure that includes the semiconductor layer at an appropriate temperature. Such annealing and photovoltaic structure release follow wafer bonding in one or more embodiments. The annealing may be supplemented by the application of a mechanical force to fracture the structure along the implanted cleavage plane. First and second structures are thereby obtained. The first structure includes the off-cut silicon substrate and a portion of the original germanium layer 42. The second structure includes the carrier substrate 24 and the lattice engineered semiconductor stack comprising the photovoltaic structure 52 bonded thereto. Residual germanium that may be present on the photovoltaic structure 52 after release can be removed by a selective etch or CMP. In some embodiments, release of the photovoltaic structure 52 can include etching of the germanium layer 42. U.S. Pat. No. 6,326,285 also discloses hydrogen implantation, wafer bonding, and cleaving along the hydrogen layer.

The silicon carrier substrate 24, which is bulk silicon with an oxide layer 28 in one or more embodiments, is positioned in opposing relation to an exposed surface of the photovoltaic structure 52. Conventional wafer bonding techniques familiar to those of skill in the art are employed to bond the carrier substrate 24 to the III-V photovoltaic structure 52. A structure as shown schematically in FIG. 2 is thereby obtained. An oxide layer or a dielectric surface layer (not shown), may be formed on the surface of the photovoltaic structure 52 to be bonded to the oxide layer 28 of the carrier substrate 24 in some embodiments to facilitate bonding.

Figure 3:
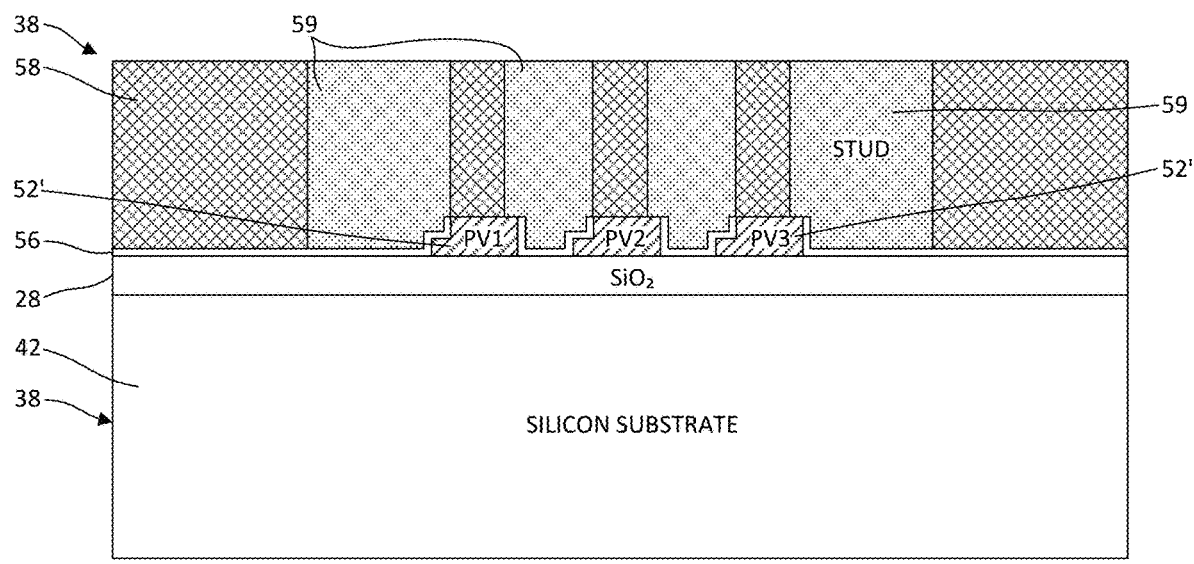
FIG. 3 is a schematic, cross-sectional illustration of III-V photovoltaic devices bonded to a carrier substrate.

FIG. 3 schematically illustrates an assembly 55 including a plurality of III-V photovoltaic structures 52' bonded to a silicon-based carrier substrate 24. The photovoltaic structures 52' can be fabricated as described above with respect to FIG. 2. Individual, electrically isolated photovoltaic structures 52' are obtained from the photovoltaic structure 52 using, for example, conventional lithography patterning, and etching techniques. The III-V semiconductor materials between the photovoltaic structures 52' are removed for electrical isolation. Metal contacts can be formed using metal deposition processes. The photovoltaic structures can be connected in series using metal wiring fabricated using electroplating or other suitable method.

A metal layer 56 electrically connects the photovoltaic structures 52' in series using p to n terminal connections. In an exemplary embodiment, the width of each photovoltaic structure is about one hundred twenty microns (120 μm). An encapsulation layer 58 is formed over the photovoltaic structures 52'. In some embodiments the encapsulation layer is a polyimide layer. Other polymers may alternatively be employed depending on the required performance characteristics. Metal (e.g. copper) studs 59 are electrically connected to the photovoltaic structures and extend upwardly from the metal layer 56 through the encapsulation layer 58 Each photovoltaic structure 52' is electrically connected to two of the metal studs. The assembly 55 can be employed, for example, in IoT applications. Additional devices, such as the silicon-based solar cells 38, can optionally be bonded to the carrier substrate 24.

Figure 4:
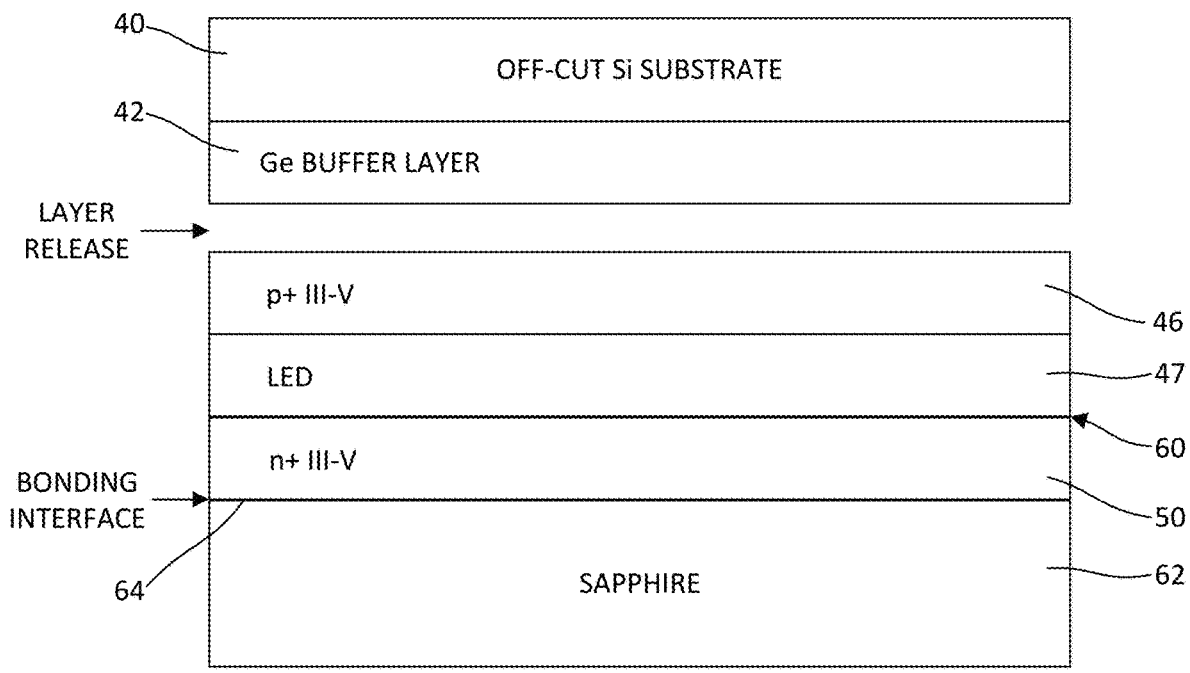
FIG. 4 is a schematic, cross-sectional illustration of III-V LED structure released from a donor substrate and bonded to a carrier substrate.

A III-V LED structure 60 on sapphire is obtained in accordance with a further embodiment. Structures such as light-emitting diodes benefit from the use of relatively transparent substrates such as sapphire substrates. An exemplary structure is shown in FIG. 4. Heavily doped III-V layers are epitaxially grown on a germanium buffer layer using techniques as described above with respect to FIG. 3. The germanium buffer layer 42 is epitaxially grown on an off-cut silicon substrate 40. The first III-V semiconductor layer 46 of the optoelectronic light emission device is typically grown to a thickness ranging from one micron to two microns (1-2 μm) and has a first conductivity type (n+ or p+).

Following formation of the first III-V semiconductor layer 46 having the first conductivity type, the layers of a III-V quantum well layered stack 47 may be epitaxially formed on the first III-V semiconductor layer. The III-V quantum well layered stack may include a layered stack of intrinsic III-V semiconductor materials. The epitaxial deposition process for forming the III-V layered stack may be a selective epitaxial deposition process wherein the III-V semiconductor material only forms on the exposed semiconductor surfaces, such as the upper surface of the first III-V semiconductor layer 46 of the optoelectronic light emission device and is not formed on exposed dielectric surfaces (if present). The different compositions of the III-V quantum well layered stack may be provided by changing and cycling the precursor gases used in growing the different layers comprising the layered stack.

Following the formation of the III-V quantum well layered stack of the optoelectronic light emission device, a second III-V semiconductor layer 50 having a second conductivity type is epitaxially formed on a top surface of the III-V quantum well layered stack 47. The second conductivity type is opposite to the first conductivity type. For example, when the first doped III-V semiconductor layer 46 of the stack has p-type conductivity, the second doped III-V semiconductor layer 50 at the top of the stack has n-type conductivity. The III-V stack may be planarized, e.g., processed with chemical mechanical planarization.

The first and second III-V semiconductor material layers 46, 50, which may also be referred to as cladding layers, function to pump charge carriers, i.e., electron and hole charge carriers, into the intrinsic active area provided by the quantum well. In some examples, the doped first and second III-V semiconductor layers 46, 50 may be composed of InP, GaAs, AlGaAs, InAlAs or a combination thereof. The dopants that provide the conductivity types of the first and second III-V semiconductor layers of the device may be present in a concentration ranging from $10^{17}$ atoms/cm$^3$ to $10^{20}$ atoms/cm$^3$. The top and bottom III-V semiconductor cladding layers may each have a thickness ranging from 100 nm to 2,000 nm. It is noted that the above compositions and thicknesses are provided for illustrative purposes only, and are not intended to limit the present disclosure. The active region of the laser diode is in the intrinsic (I) region.

The active region in the quantum well structure is formed by alternating layers of relatively low bandgap material and layers of relatively high bandgap material. As used herein, a "low bandgap" is a bandgap ranging from 0.5 eV to 3.0 eV; a "high bandgap" ranges from 1.0 eV to 3.5 eV. The low bandgap layers are termed "well layers" and the high bandgap layers are termed "barrier layers." For example, the active low bandgap layers may comprise $Al_rGa_{1-r}As$ and the passive high bandgap layers may comprise $Al_zGa_{1-z}As$ with r<z. The wavelength of the light emitted by the quantum well laser is determined by the width of the active region, not just the bandgap of the material from which it is constructed.

The thickness of each layer of III-V compound semiconductor material within the quantum well is preferably no greater than about 50 nm, and is for example between five and ten nanometers (5-10 nm) in some embodiments. The stacked structures of quantum wells may, for example, include up to one hundred layers. In some embodiments, the stacked structures of quantum wells is composed of five layers or less of semiconductor material. The quantum well (QW) layers and barrier layers of the quantum well structure may be formed, for example, of $In_xGa_{1-x}As$, $P_{1-y}$, $In_xGa_{1-x}As$, $In_xGa_{1-x}N_yAs_{1-y}$, $In_xGa_{1-x}As_ySb$ (where, 0.0<x<1.0, 0.0<y<1.0).

The optoelectronic structure 60 comprising the first and second doped III-V semiconductor layers 46, 50 and the III-V quantum well layered stack 47 is released from the germanium buffer layer 42. Techniques as described above for releasing the photovoltaic structure 38 from a germanium buffer layer may be employed for releasing the optoelectronic structure 60. The released structure may be bonded directly to the sapphire carrier substrate 62 along a bonding interface 64 as schematically illustrated in FIG. 4. Oxide-to-oxide bonding of the optoelectronic structure 60 to the sapphire carrier substrate along the bonding interface 64 is performed in some embodiments. In an alternative embodiment, the optoelectronic structure 60 may be bonded to an oxide layer of a silicon carrier substrate (not shown).

In some alternative embodiments, III-V optoelectronic structures or III-V photovoltaic structures are grown on electrically isolated "islands" (not shown) formed on an off-cut semiconductor substrate. The germanium layer may be patterned prior to epitaxial growth of III-V layers thereon. Accordingly, individual devices may be transferred from the off-cut substrate to a carrier substrate rather than layers that are used to form individual devices on the carrier substrate. The growth on the edges of an "island" may not, however, be entirely orthogonal to the off-cut substrate.

Figure 5:
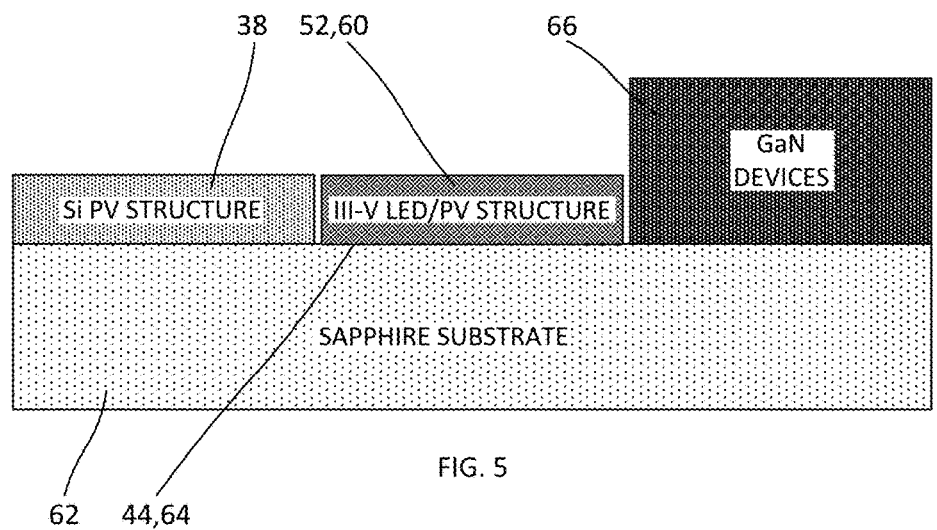
FIG. 5 is a schematic, cross-sectional view showing silicon-based photovoltaic structures, III-V LED and/or photovoltaic structures, and gallium nitride devices on a common carrier substrate.

As schematically illustrated in FIG. 5, different types of devices can be integrated on the same carrier substrate using techniques as described above, including silicon-based and III-V structures. In one exemplary embodiment, various types of devices are bonded to a sapphire carrier substrate 62. A first region of the exemplary sapphire carrier substrate includes a silicon-based photovoltaic structure 38 or a plurality of such photovoltaic structures. A second region thereof includes one or more compound semiconductor structures such as an LED structure 60 as described above with respect to FIG. 4 or a compound semiconductor photovoltaic structure 52. A third region includes gallium nitride devices 66. As the devices are epitaxially grown on other substrates, released from the substrates, and bonded to a carrier substrate, they are in direct contact with the sapphire carrier substrate to which they are bonded in some embodiments. Bonding may be facilitated by forming an oxide layer on the silicon-based photovoltaic structure and/or the III-V structure(s) to enable oxide-oxide bonding to the sapphire carrier substrate. (Sapphire comprises aluminum oxide.)

The devices bonded to the various regions of the sapphire carrier substrate can be subjected to appropriate lithography techniques to form a plurality of individual devices in each region of the carrier substrate from the transferred epitaxial structure. The silicon PV structure 38 shown in FIG. 5 may accordingly comprise a plurality of discrete silicon PV structures on the carrier substrate 62. Similarly, III-V photovoltaic structures, such as the structure shown in FIG. 2, can be bonded to the sapphire carrier substrate 62 and subjected to lithography on the carrier substrate to obtain individual photovoltaic devices as illustrated in FIG. 3. Metallization and wiring layers may then be formed.

Electronic devices comprising the III-V or silicon-based optoelectronic devices may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1$^{st}$ Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a compound semiconductor device includes epitaxially growing a germanium layer 42 on an off-cut semiconductor substrate. A first compound semiconductor layer 46 having a first conductivity type is epitaxially grown on the germanium layer. An intrinsic compound semiconductor layer (48 or 47) is epitaxially grown on the first compound semiconductor layer and a second compound semiconductor layer 50 is epitaxially grown on the intrinsic compound semiconductor layer. The second compound semiconductor layer has a second conductivity type opposite from the first conductivity type. The method further includes releasing a monolithic structure 52 comprising the first compound semiconductor layer, the intrinsic compound semiconductor layer and the second compound semiconductor layer from the off-cut semiconductor substrate and bonding the monolithic structure 52 to an electrically insulating surface of a carrier substrate. Bonding is performed prior to releasing in one or more embodiments. Bonding the monolithic structure to the electrically insulating surface of the carrier substrate further may further include directly contacting the second compound semiconductor layer to the electrically insulating surface. Some embodiments of the method include forming a plurality of optoelectronic devices 52' from the monolithic structure 52 on the carrier substrate. A structure 55 as schematically illustrated in FIG. 3 may accordingly be obtained.

Further given the above discussion, a method of fabricating a structure including a solar cell is provided. An exemplary method includes epitaxially growing an undoped semiconductor layer on a doped semiconductor substrate having a first conductivity type, and epitaxially growing a doped semiconductor layer on the undoped semiconductor layer wherein the doped semiconductor layer has a second conductivity type opposite from the first conductivity type. A solar cell 38 comprising the undoped semiconductor layer, the doped semiconductor layer and a surface layer of the doped semiconductor substrate is released and bonded to an electrically insulating surface of a carrier substrate as schematically illustrated in FIG. 1.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having optoelectronic or other devices therein.

An integrated circuit in accordance with aspects of the present disclosure can be employed in essentially any application and/or electronic system where the use of devices as disclosed herein would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An optoelectronic assembly comprising:
    a carrier substrate including an electrically insulating surface;
    an optoelectronic structure bonded to the electrically insulating surface of the carrier substrate, the optoelectronic structure including:
        a first semiconductor layer having a first conductivity type;
        an intrinsic semiconductor layer on the first semiconductor layer; and
        a second semiconductor layer on the intrinsic semiconductor layer and having a second conductivity type, the second conductivity type being opposite from the first conductivity type, the intrinsic semiconductor layer being between the first semiconductor layer and the second semiconductor layer;
    wherein:
    one of the first semiconductor layer and the second semiconductor layer is bonded to the electrically insulating surface of the carrier substrate;
    the substrate comprises sapphire; and
    the optoelectronic structure comprises a III-V structure including light-emitting diodes;
    further comprising:
    a photovoltaic structure bonded to the electrically insulating surface of the carrier substrate, the photovoltaic structure comprising:
        a first doped layer comprising silicon;
        an intrinsic layer comprising silicon on the first doped layer; and
        a second doped layer comprising silicon and on the intrinsic layer, the second doped layer and first doped layer have opposite conductivity types; and
    a region, with gallium nitride devices, on the substrate.

2. The optoelectronic assembly of claim 1, wherein the first semiconductor layer, the intrinsic semiconductor layer, and the second semiconductor layer have the same crystalline characteristics.

* * * * *